(12) United States Patent
Kobayashi et al.

(10) Patent No.: US 12,149,848 B2
(45) Date of Patent: Nov. 19, 2024

(54) PHOTOELECTRIC CONVERSION APPARATUS, PHOTOELECTRIC CONVERSION SYSTEM, MOVING BODY, AND SEMICONDUCTOR SUBSTRATE

(71) Applicant: CANON KABUSHIKI KAISHA, Tokyo (JP)

(72) Inventors: Hideo Kobayashi, Tokyo (JP); Takanori Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 17/550,692

(22) Filed: Dec. 14, 2021

(65) Prior Publication Data

US 2022/0208810 A1    Jun. 30, 2022

(30) Foreign Application Priority Data

Dec. 24, 2020    (JP) .................................. 2020-215239

(51) Int. Cl.
  *H04N 25/75* (2023.01)
  *H04N 25/766* (2023.01)
  *H04N 25/77* (2023.01)
  *H04N 25/79* (2023.01)

(52) U.S. Cl.
  CPC ........... *H04N 25/766* (2023.01); *H04N 25/75* (2023.01); *H04N 25/77* (2023.01); *H04N 25/79* (2023.01)

(58) Field of Classification Search
  None
  See application file for complete search history.

(56) References Cited

U.S. PATENT DOCUMENTS

2002/0154347 A1* 10/2002 Funakoshi ........... H04N 25/134
                                                   348/E3.02
2009/0096904 A1*  4/2009 Moholt ................. H04N 25/75
                                                     348/308

(Continued)

FOREIGN PATENT DOCUMENTS

EP       1473926 A2    11/2004
JP    2013-034179 A     2/2013

(Continued)

OTHER PUBLICATIONS

Title: Translation of JP 202005507 Author: Gohara Yoshitomo Date: Dec. 24, 2020 (Year: 2020).*

(Continued)

*Primary Examiner* — Cynthia Segura
*Assistant Examiner* — Wesley J Chiu
(74) *Attorney, Agent, or Firm* — Canon U.S.A., Inc. IP Division (57) ABSTRACT

An apparatus includes a pixel array in which pixels including first, second, and third pixels are arranged. In a top plan view of the pixel array, the first and second pixels are arranged along a first direction, and the first pixel is away from the second pixel in a positive direction of the first direction. The first and third pixels are arranged along a second direction and are connected to a first line. The second pixel is connected to a second line. The first and second lines are connected to first and second processing circuits, respectively. The first and second processing circuits are arranged along the first direction, and the first processing circuit is away from the second processing circuit in a negative direction of the first direction. Calculation processing is performed on outputs from the first and second lines.

25 Claims, 7 Drawing Sheets

(56) References Cited

U.S. PATENT DOCUMENTS

| | | | |
|---|---|---|---|
| 2011/0019067 A1* | 1/2011 | Matsumoto | H04N 23/672 |
| | | | 348/346 |
| 2013/0033632 A1* | 2/2013 | Kishi | H04N 25/75 |
| | | | 348/308 |
| 2013/0076973 A1* | 3/2013 | Kobayashi | H04N 23/743 |
| | | | 348/362 |
| 2016/0205335 A1 | 7/2016 | Hiwada | |
| 2017/0257582 A1* | 9/2017 | Jung | H04N 25/76 |
| 2018/0227551 A1* | 8/2018 | Shishido | H04N 23/10 |
| 2019/0123088 A1* | 4/2019 | Kwon | H01L 27/14634 |
| 2020/0244894 A1 | 7/2020 | Ochiai | |

FOREIGN PATENT DOCUMENTS

| | | | |
|---|---|---|---|
| JP | 2015-26675 A | | 2/2015 |
| JP | 2017183658 A | | 10/2017 |
| JP | 2018-191040 A | | 11/2018 |
| JP | 2020-191543 A | | 11/2020 |
| JP | 2020205507 A | * | 12/2020 |
| JP | 2021-5794 A | | 1/2021 |
| WO | 2006/129762 A1 | | 12/2006 |

OTHER PUBLICATIONS

Jin, Wu, et al.; "Infrared ranging technology by using single photon APD array readout integrated circuit"; Infrared and Laser Engineering; vol. 46, No. 6; Jun. 2017; pp. 0604002-1-0604002-6.

* cited by examiner

PHOTOELECTRIC CONVERSION APPARATUS, PHOTOELECTRIC CONVERSION SYSTEM, MOVING BODY, AND SEMICONDUCTOR SUBSTRATE

BACKGROUND

Field of the Disclosure

The aspect of the embodiments relates to a photoelectric conversion apparatus, a photoelectric conversion system including the photoelectric conversion apparatus, a moving body including the photoelectric conversion apparatus, and a semiconductor substrate.

Description of the Related Art

Japanese Patent Application Laid-Open No. 2017-183658 discusses a solid-state imaging apparatus that reads pixel signals by using two signal processing circuits.

The solid-state imaging apparatus discussed in Japanese Patent Application Laid-Open No. 2017-183658 has an issue where, when horizontal addition processing is performed on pixel signals, the reading speed decreases or the signal processing becomes complicated.

SUMMARY

The aspect of the embodiments is directed to, in a photoelectric conversion apparatus configured to read pixel signals by using two signal processing circuits and capable of performing analog or digital calculation appropriately, suppressing a decrease in reading speed or the complication of signal processing.

According to an aspect of the embodiments, an apparatus includes a pixel array in which a plurality of pixels including a first pixel, a second pixel, and a third pixel is arranged. In a top plan view of the pixel array, the first pixel and the second pixel are arranged along a first direction, and the first pixel is located away from the second pixel in a positive direction of the first direction. The first pixel and the third pixel are arranged along a second direction. The first pixel and the third pixel are connected to a first line. The second pixel is connected to a second line. The first line is connected to a first processing circuit. The second line is connected to a second processing circuit. The first processing circuit and the second processing circuit are arranged along the first direction, and the first processing circuit is located away from the second processing circuit in a direction having a component in a negative direction of the first direction. Calculation processing is performed on an output from the first line and an output from the second line.

According to another aspect of the embodiments, a substrate laminated on another substrate including a pixel array in which a plurality of pixels including a first pixel is arranged, and a first line connected to the first pixel includes a first processing circuit and a second line. The first pixel is connected to the first processing circuit via the first line and the second line. In a top plan view of the pixel array, the first line and the second line intersect each other.

Further features of the disclosure will become apparent from the following description of exemplary embodiments with reference to the attached drawings.

DESCRIPTION OF THE EMBODIMENTS

Exemplary embodiments of the disclosure will be described below with reference to the drawings.

In the exemplary embodiments described below, an imaging apparatus will be mainly described as an example of a photoelectric conversion apparatus. The exemplary embodiments, however, are not limited to the imaging apparatus, and are also applicable to other examples of the photoelectric conversion apparatus. The other examples include a distance measuring apparatus (an apparatus that measures a distance by using focus detection or time of flight (ToF)) and a photometric apparatus (an apparatus that measures the amount of incident light).

Figure 1:
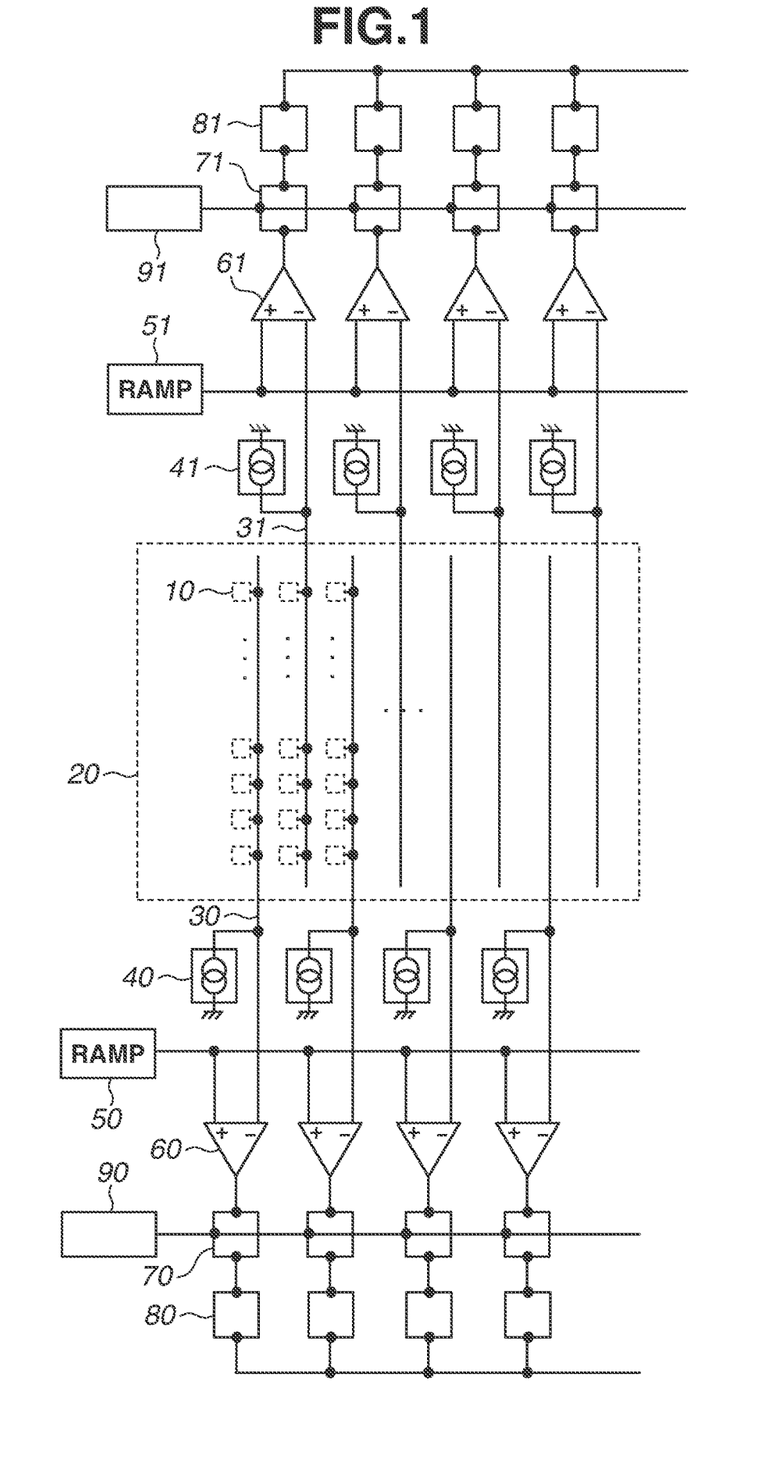
FIG. 1 is a schematic diagram of a photoelectric conversion apparatus according to a first exemplary embodiment.
Figure 2:
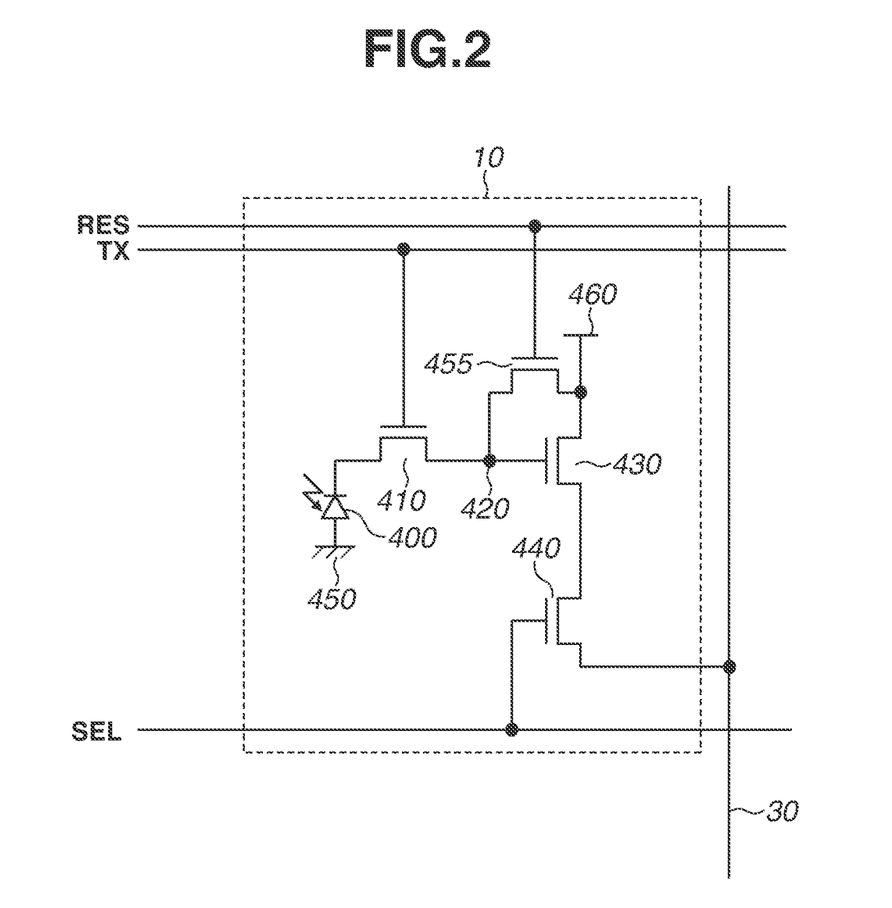
FIG. 2 is another schematic diagram of the photoelectric conversion apparatus according to the first exemplary embodiment.
Figure 3:
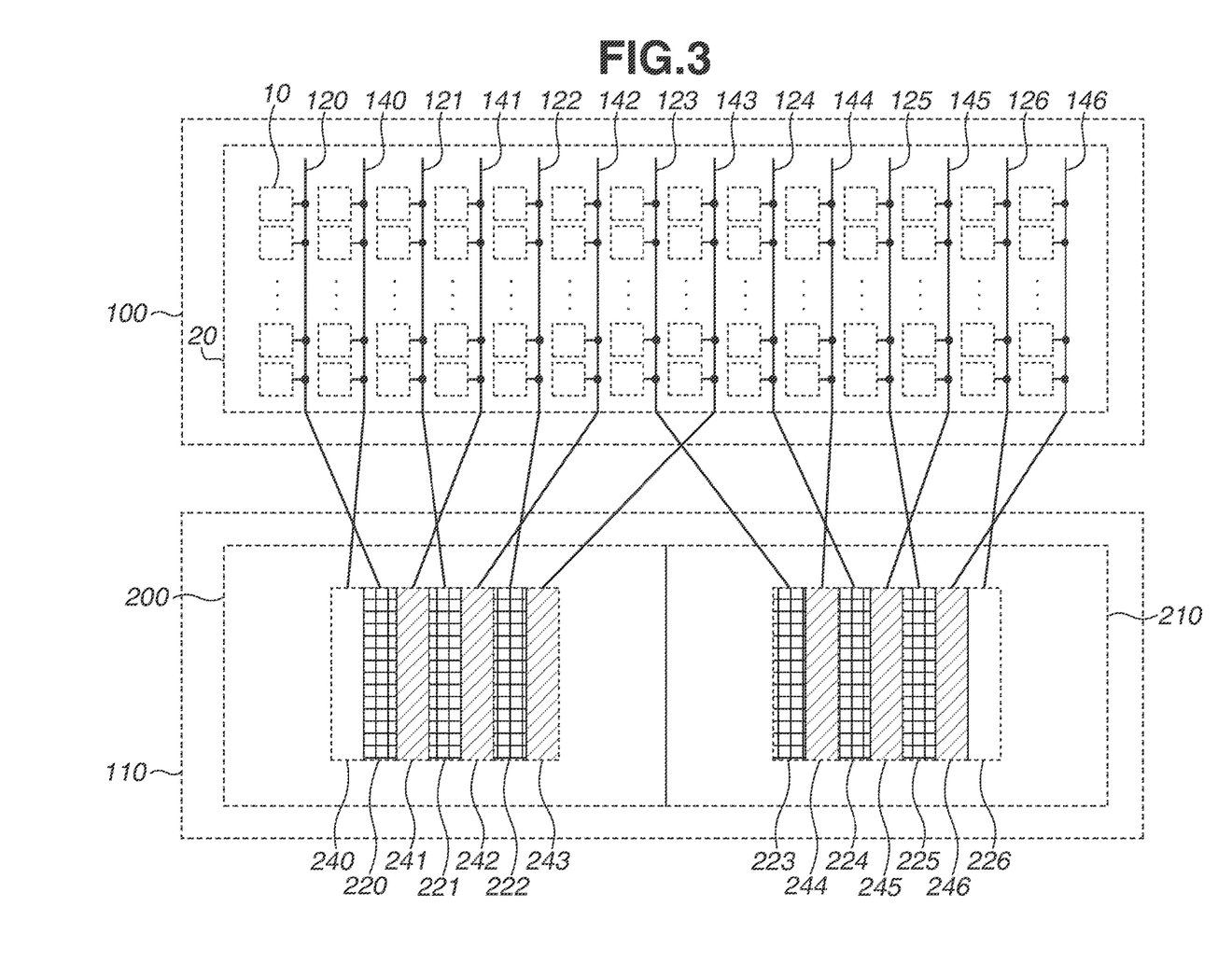
FIG. 3 is yet another schematic diagram of the photoelectric conversion apparatus according to the first exemplary embodiment.

FIGS. 1, 2, and 3 are schematic diagrams each illustrating a photoelectric conversion apparatus according to a first exemplary embodiment of the disclosure.

The photoelectric conversion apparatus illustrated in FIG. 1 includes a pixel 10, a pixel array 20, a vertical line 30, a vertical line 31, a current source 40, a current source 41, a ramp signal generation circuit 50, a ramp signal generation circuit 51, a comparator 60, and a comparator 61. The photoelectric conversion apparatus further includes a first memory 70, a first memory 71, a second memory 80, a second memory 81, a counter 90, and a counter 91.

In the pixel array 20, a plurality of the pixels 10 is arranged in an array of a plurality of rows and a plurality of columns.

In each column of the pixel array 20, the vertical line 30 or 31 is arranged extending in a column direction (a vertical direction in FIG. 1). Each of the vertical lines 30 and 31 is connected to the pixels 10 arranged in the column direction and serves as a signal line common to the connected pixels 10.

The number of pixels 10 included in the pixel array 20 is not particularly limited. For example, like a general digital camera, the pixel array 20 may include several thousands of rows of the pixels 10 and several thousands of columns of the pixels 10. Alternatively, the pixel array 20 may include a plurality of the pixels 10 arranged in a single row.

Pixel signals read from the pixels 10 are input to column signal processing circuits (unit circuits described below) via the vertical line 30 and 31. Each of the column signal processing circuits includes the comparator 60 or 61 that compares the pixel signals read from the pixels 10 with a reference signal output from the ramp signal generation circuit 50 or 51, and the first memory 70 or 71 and the second memory 80 or 81 that hold the pixel signals. The pixel signals are sequentially output via signal processing circuits (described below) on a column-by-column basis.

<Pixel Configuration>

A configuration of each of the pixels 10 according to the present exemplary embodiment will be described next.

FIG. 2 illustrates an example of an equivalent circuit of the pixel 10. The pixel 10 includes a photodiode 400, a transfer transistor 410, a floating diffusion 420, a source follower transistor 430, a selection transistor 440, a ground (GND) node 450, a reset transistor 455, and a power supply node 460.

The photodiode 400 is grounded at the GND node 450. The photodiode 400 is connected to the transfer transistor 410. A control signal is input from a control signal line TX to the gate of the transfer transistor 410. The transfer transistor 410 includes a node in common with the reset transistor 455 and the gate of the source follower transistor 430, and the common node corresponds to the floating diffusion 420. The reset transistor 455 and the source follower transistor 430 are both connected to the power supply node 460. A reset signal is input from a reset signal line RES to the gate of the reset transistor 455. The source follower transistor 430 is connected to the selection transistor 440. A selection signal is input from a selection signal line SEL to the gate of the selection transistor 440. The selection transistor 440 is connected to the vertical line 30.

<Functions of Elements>

Functions of elements of the photoelectric conversion apparatus according to the present exemplary embodiment will be described next.

The photodiode 400 photoelectrically converts incident light to generate electric charge.

The electric charge generated through the photoelectric conversion by the photodiode 400 is transferred to the floating diffusion 420 via the transfer transistor 410 and is converted into a signal voltage by a parasitic capacitor associated with the floating diffusion 420. The signal voltage is input to the gate of the source follower transistor 430 and is output to the vertical line 30 via the selection transistor 440. The source follower transistor 430 and the current source 40 illustrated in FIG. 1 form a source follower, and the signal voltage on the floating diffusion 420 is output to the vertical line 30 via the source follower.

The comparator 60 compares the signal output to the vertical line 30 with a ramp signal output from the ramp signal generation circuit 50. At the timing when the output of the comparator 60 changes, the first memory 70 obtains a count signal from the counter 90, so that the signal from the pixel 10 is subjected to analog-to-digital (AD) conversion. The digital signal held in the first memory 70 is transferred to the second memory 80 and then output to the outside of the chip. In the present exemplary embodiment, an example where the plurality of column signal processing circuits uses the common counter 90 or 91 is described. However, a configuration in which a common count clock is supplied to each of the column signal processing circuits, and counters are disposed for the respective column signal processing circuits corresponding to the vertical lines 30 and 31 is also generally used. The present exemplary embodiment can also be applied to such a configuration.

<Element Arrangement of Photoelectric Conversion Apparatus>

FIG. 3 is a schematic diagram illustrating an example of arrangement of the elements of the photoelectric conversion apparatus according to the present exemplary embodiment.

FIG. 3 illustrates the photoelectric conversion apparatus having a laminated structure including a pixel substrate 100 and a circuit substrate 110.

In the photoelectric conversion apparatus illustrated in FIG. 3, the pixel array 20 is arranged on the pixel substrate 100. Vertical lines 120 to 126 are signal lines corresponding to odd numbered columns of the pixel array 20. Vertical lines 140 to 146 are signal lines corresponding to even numbered columns of the pixel array 20. Hereinafter, the vertical lines 120 to 126 will be referred to as a "vertical line group 1", and the vertical lines 140 to 146 will be referred to as a "vertical line group 2".

The circuit substrate 110 includes two signal processing circuits 200 and 210, and the signal processing circuits 200 and 210 read signals from the pixels 10 included in the pixel array 20. The signal processing circuits 200 and 210 include unit circuits 220 to 226 that read signals from the vertical line group 1, and unit circuits 240 to 246 that read signals from the vertical line group 2. Hereinafter, the unit circuits 220 to 226 will be referred to as a "signal processing circuit 1", and the unit circuits 240 to 246 will be referred to as a "signal processing circuit 2".

For example, the signal processing circuits 1 and 2 include the current sources 40, the comparators 60, the first memories 70, and the second memories 80 that are illustrated in FIG. 1.

In the example illustrated in FIG. 3, the arrangement order of the vertical lines 120 to 126 and 140 to 146 on the pixel substrate 100 and the arrangement order of the corresponding unit circuits 220 to 226 and 240 to 246 on the circuit substrate 110 are different from each other.

<Comparative Example of Element Arrangement>

Figure 4:
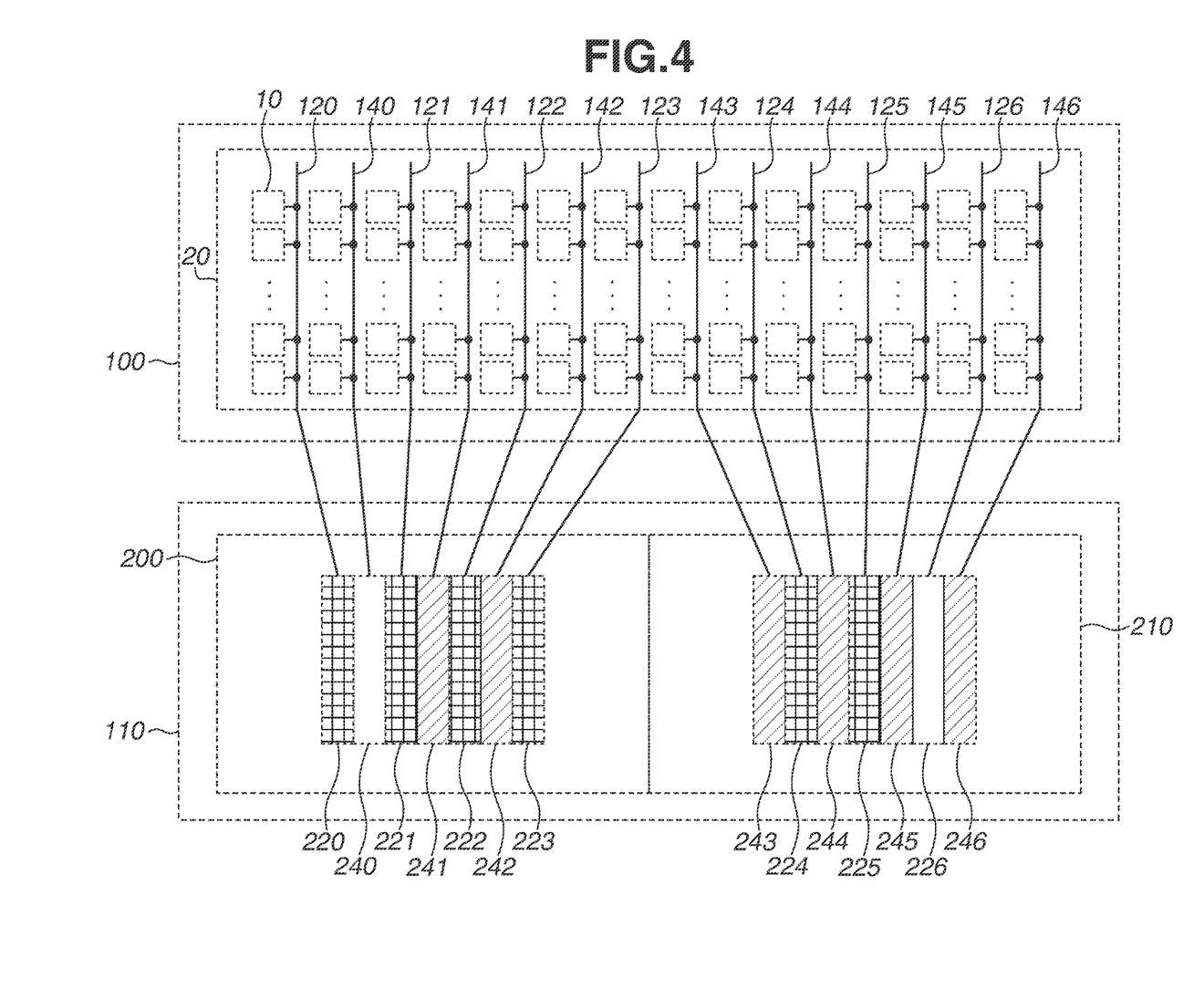
FIG. 4 is a schematic diagram of a photoelectric conversion apparatus according to a comparative example of the first exemplary embodiment.

FIG. 4 illustrates a comparative example of the arrangement of the elements of the photoelectric conversion apparatus.

FIGS. 3 and 4 are different in the connection relationship between the vertical line group 1 (the vertical lines 120 to 126) and the vertical line group 2 (the vertical lines 140 to 146), and the signal processing circuit 1 (the unit circuits 220 to 226) and the signal processing circuit 2 (the unit circuits 240 to 246).

In the comparative example illustrated in FIG. 4, the arrangement order of the vertical lines 120 to 146 on the pixel substrate 100 and the arrangement order of the corresponding unit circuits 220 to 246 on the circuit substrate 110 match each other.

In a general photoelectric conversion apparatus, pixel signals read from the vertical line group 1 and pixel signals read from vertical line group 2 correspond to different colors. For example, red pixel signals are read from the vertical line group 1, whereas green pixel signals are read from the vertical line group 2. For example, the pixels 10 are associated with colors by arranging a color filter corresponding to the wavelength range of visible light of a particular single color, such as red, green, or blue, on each of the pixels 10. In addition, in a case where addition processing is performed on signals from the pixels 10 arranged in the horizontal direction, the position of the green pixels subject to the addition may be shifted from the position of the red pixels subject to the addition in the horizontal direction.

For example, consider a case where in FIG. 4, addition processing is performed on signals based on the electric charge generated in the pixels 10 in three rows arranged in the horizontal direction. Assuming that signals of the unit circuits 220 to 222 of the signal processing circuit 1, which read signals from the vertical lines 120 to 122 of the vertical line group 1, are the addition targets, signals of the unit circuits 241 to 243 of the signal processing circuit 2, which read signals from the vertical lines 141 to 143 of the vertical line group 2, are the addition targets. At this time, a signal from the vertical line 140 of the vertical line group 2 is not the addition target.

As illustrated in FIG. 4, in a case where the vertical line group 1 (the vertical lines 120 to 126) and the signal processing circuit 1 (the unit circuits 220 to 226) are sequentially connected together, and the vertical line group 2 (the vertical lines 140 to 146) and the signal processing circuit 2 (the unit circuits 240 to 246) are sequentially connected together, the following issue arises.

In FIG. 4, the unit circuits 241 to 243 of the signal processing circuit 2, which process the signals from the vertical lines 141 to 143 of the vertical line group 2 as the addition targets, are arranged dispersedly in the two signal processing circuits 200 and 210. The same applies to the unit circuits 223 to 225 of the signal processing circuit 1 which process the signals from the vertical lines 123 to 125 of the vertical line group 1. At this time, when addition processing is performed on digital signals among the unit circuits 241 to 243, signal exchange is to be performed between the two signal processing circuits 200 and 210, which makes the signal processing complicated. Additionally, for example, in a case where lateral wiring for connecting the unit circuits 241 to 243 of the signal processing circuit 2 is provided to perform addition processing on analog signals before AD conversion, the wiring length of the wiring is long, and the processing speed decreases due to parasitic capacitance.

In FIG. 3, connections between the vertical line group 1 (the vertical lines 120 to 126) and the signal processing circuit 1 (the unit circuits 220 to 226) and connections between the vertical line group 2 (the vertical lines 140 to 146) and the signal processing circuit 2 (the unit circuits 240 to 246) intersect each other. In other words, in a top plan view of the pixel array 20, for example, if a vertical line included in the vertical line group 1 is located to the left of a vertical line included in the vertical line group 2, the corresponding unit circuit included in the signal processing circuit 1 is located to the right of the corresponding unit circuit included in the signal processing circuit 2. This can avoid the arrangement where the unit circuits 241 to 243 of the signal processing circuit 2, which process the signals from the vertical lines 141 to 143 of the vertical line group 2 as the addition targets, are dispersed in the two signal processing circuits 200 and 210. The same applies to, for example, the unit circuits 223 to 225 of the signal processing circuit 1, which process the signals from the vertical lines 123 to 125 of the vertical line group 1 as the addition targets in a case where addition processing is performed on the signals from the pixels 10 in three rows in the horizontal direction.

As described above, in the present exemplary embodiment, when a solid-state imaging apparatus configured to read pixel signals by using two signal processing circuits performs horizontal addition processing on analog or digital signals, it is possible to suppress a decrease in reading speed or the complication of signal processing.

To clearly indicate the difference between the connections between the vertical lines 120 to 146 and the unit circuits 220 to 246, FIGS. 3 and 4 schematically illustrate the connections. Although not clearly indicated in FIGS. 3 and 4, in a connecting portion for signal connection between the pixel substrate 100 and the circuit substrate 110, a known technique such as a through-silicon via (TSV) electrode that passes through the pixel substrate 100 and the circuit substrate 110 or hybrid bonding is used. For example, if the hybrid bonding is used, a bonding portion between an insulator of the pixel substrate 100 and an insulator of the circuit substrate 110 and a bonding portion between a metal of the pixel substrate 100 and a metal of the circuit substrate 110 are formed on a bonding surface.

While in the present exemplary embodiment, the laminated structure is described as an example, the structure of the photoelectric conversion apparatus is not limited thereto. The present exemplary embodiment can also be applied to a photoelectric conversion apparatus having a single substrate.

In the photoelectric conversion apparatus illustrated in FIG. 3, neither of the signal processing circuits 1 and 2 is arranged near a bonding portion between the signal processing circuits 200 and 210. Alternatively, for example, a vertical scanning circuit for driving the signal processing circuits 1 and 2 arranged in each of the signal processing circuits 200 and 210 may be disposed.

While the case where addition processing is performed on analog pixel signals has been described above as an example, calculation processing performed by the photoelectric conversion apparatus according to the present exemplary embodiment is not limited to the addition processing. For example, the present exemplary embodiment is applicable to a case where calculation processing such as edge detection or calculation between autofocus (AF) signals by subtraction processing, or correction processing using adjacent pixels is performed on the pixel signals read from the vertical lines 120 to 146. The same applies to the following exemplary embodiments.

Figure 5:
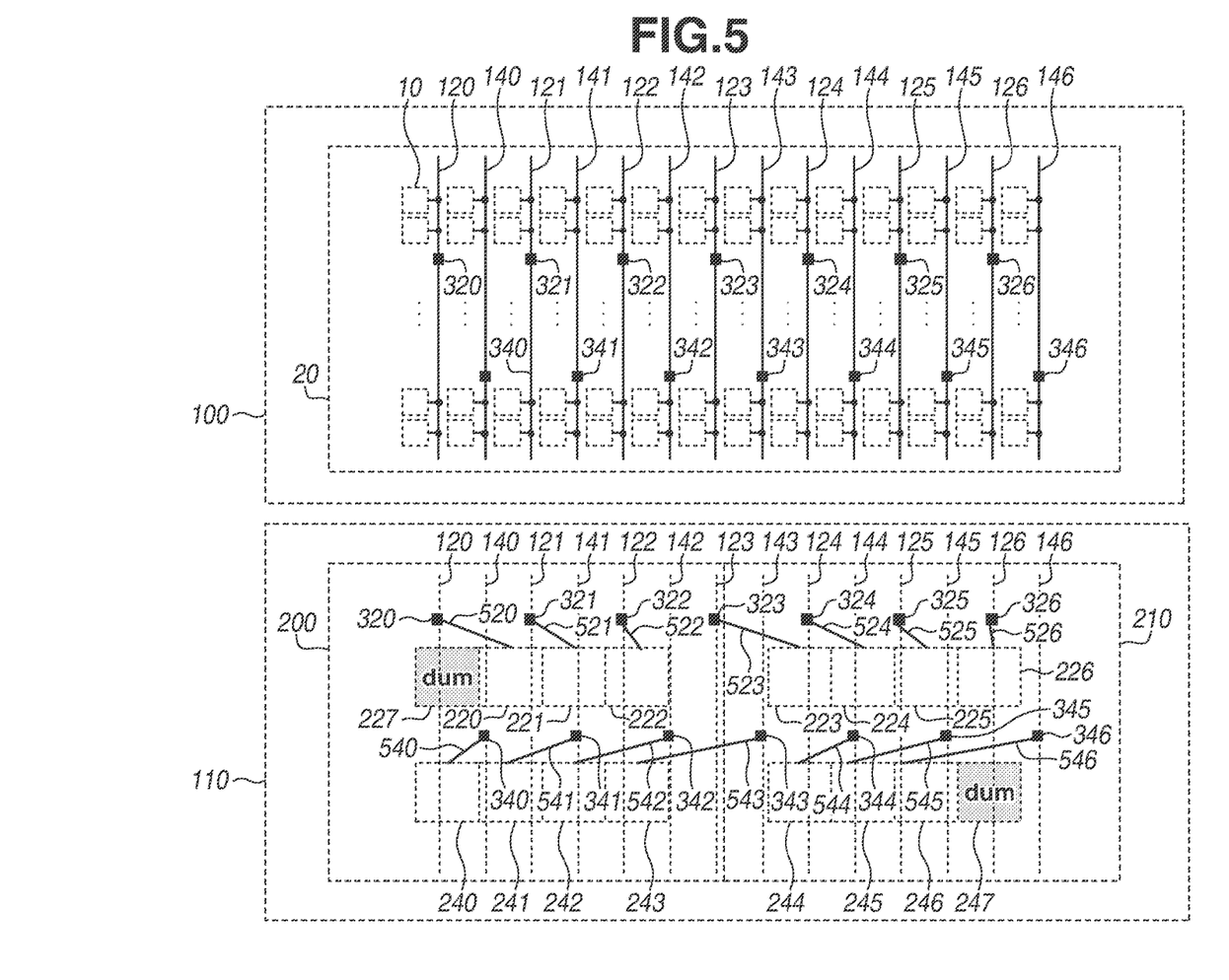
FIG. 5 is a schematic diagram of a photoelectric conversion apparatus according to a second exemplary embodiment.

FIG. 5 schematically illustrates a photoelectric conversion apparatus according to a second exemplary embodiment. A description similar to that in the first exemplary embodiment will be omitted, and only differences from FIG. 3 will be mainly described.

Unlike the photoelectric conversion apparatus illustrated in FIG. 3, in the photoelectric conversion apparatus illustrated in FIG. 5, the signal processing circuits 1 and 2 are not arranged to be adjacent to each other or mixed. The signal processing circuits 1 and 2 are arranged separately from each other. This can reduce parasitic capacitance generated between the vertical lines 120 to 126 of the vertical line group 1 and the vertical lines 140 to 146 of the vertical line group 2 and prevent color mixture.

In FIG. 5, bonding portions 320 to 326 are substrate to substrate joints between the vertical lines 120 to 126 of the vertical line group 1 and the unit circuits 220 to 226 of the signal processing circuit 1. Bonding portions 340 to 346 are substrate to substrate joints between the vertical lines 140 to 146 of the vertical line group 2 and the unit circuits 240 to 246 of the signal processing circuit 2. Connections 520 to 526 between the vertical line group 1 (the vertical lines 120 to 126) and the signal processing circuit 1 (the unit circuits 220 to 226) and connections 540 to 546 between the vertical line group 2 (the vertical lines 140 to 146) and the signal processing circuit 2 (the unit circuits 240 to 246) have direction components opposite to each other in the left-right direction. More specifically, when the direction of the connections 520 to 526 and the direction of the connections 540 to 546 are broken into an x-component and a y-component, one of the directions of the connections 520 to 526 and the connections 540 to 546 is the positive direction of the x-component, and the other is the negative direction of the x-component. In other words, the position on the pixel substrate 100 and the circuit substrate 110 where the bonding portions 320 to 326 between the vertical line group 1 and the signal processing circuit 1 are arranged and the position on the pixel substrate 100 and the circuit substrate 110 where the bonding portions 340 to 346 between the vertical line group 2 and the signal processing circuit 2 are arranged are separated away from each other in the wiring direction of the vertical lines 120 to 146. Or it can also be said that the bonding portions 340 to 346 are arranged away from the bonding portions 320 to 326 in the direction orthogonal to the direction in which the bonding portions 320 to 326 are arranged. Thus, in a top plan view of the pixel substrate 100, the photoelectric conversion apparatus includes portions where the connections 520 to 526 (the third signal line) connected to the vertical line group 1 (the first signal line) on the pixel substrate 100 intersect the vertical line group 2 (the second signal line) on the pixel substrate 100.

The arrangement having such intersection portions prevents the situation where, for example, when addition processing is performed on the signals from the pixels 10 in three rows in the horizontal direction, the unit circuits 241 to 243 that process the signals from the vertical lines 141 to 143 as the addition targets extend over the two signal processing circuits 200 and 210. The same applies to the unit circuits 223 to 225 that process the signals from the vertical lines 123 to 125 as the addition targets.

When the position on the pixel substrate 100 and the circuit substrate 110 where the bonding portions 320 to 326 are arranged and the position on the pixel substrate 100 and the circuit substrate 110 where the bonding portions 340 to 346 are arranged are separated away from each other in the wiring direction of the vertical lines 120 to 146 as described above, the signal processing circuits 1 and 2 are also arranged separately from each other on the circuit substrate 110, thereby preventing color mixture.

To achieve the above-described bonding portion arrangement, dummy circuits 227 and 247 are arranged as appropriate, thereby shifting the position of the bonding portions 320 to 326 and the position of the bonding portions 340 to 346 from each other.

As described above, in the present exemplary embodiment, when a solid-state imaging apparatus configured to read pixel signals by using two signal processing circuits performs horizontal addition processing on analog or digital signals, it is possible to suppress a decrease in reading speed or the complication of signal processing.

In the present exemplary embodiment, the connections 520 to 526 between the vertical lines 120 to 126 and the unit circuits 220 to 226 and the connections 540 to 546 between the vertical lines 140 to 146 and the unit circuits 240 to 246 do not intersect each other. This can prevent, for example, fluctuations in the potentials of the vertical lines 120 to 126 from causing crosstalk with the vertical lines 140 to 146 via parasitic capacitance.

Furthermore, since the unit circuits 220 to 226 of the signal processing circuit 1 and the unit circuits 240 to 246 of the signal processing circuit 2 are arranged separately from each other, the comparators 60 included in the unit circuits 220 to 226 and the comparators 60 included in the unit circuits 240 to 246 are arranged separately from each other. This can prevent the occurrence of color mixture due to interference in a case where the outputs of the comparators 60 change.

Figure 6:
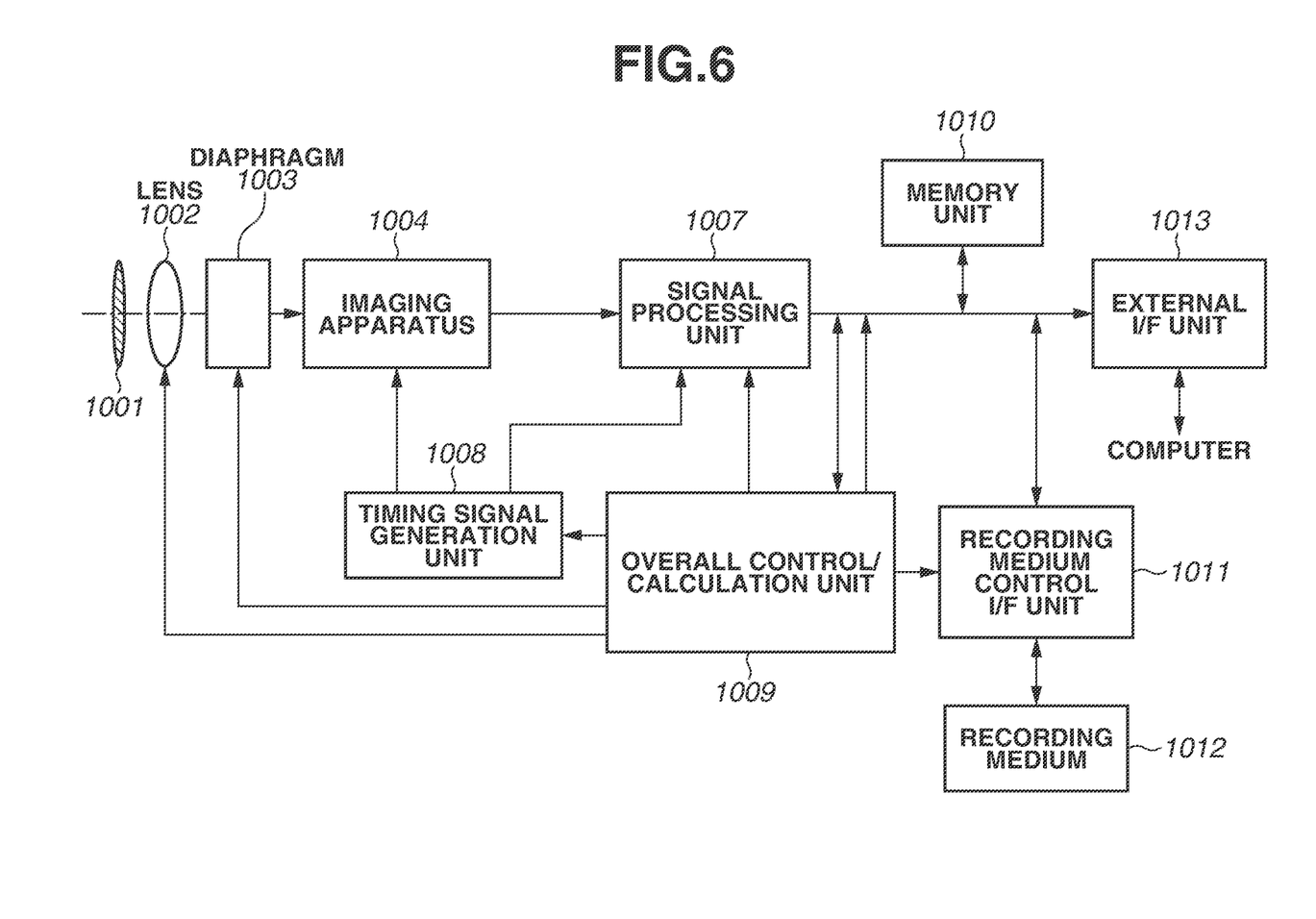
FIG. 6 is a block diagram illustrating a configuration of a photoelectric conversion system according to a third exemplary embodiment.

A photoelectric conversion system according to a third exemplary embodiment will be described with reference to FIG. 6. FIG. 6 is a block diagram illustrating a schematic configuration of the photoelectric conversion system according to the present exemplary embodiment.

The photoelectric conversion apparatuses according to the first and the second exemplary embodiment are applicable to various photoelectric conversion systems. Examples of the various photoelectric conversion systems include a digital still camera, a digital camcorder, a monitoring camera, a copying machine, a facsimile, a mobile phone, an on-vehicle camera, and an observation satellite. The various photoelectric conversion systems also include a camera module including an optical system such as a lens and an imaging apparatus. FIG. 6 is a block diagram illustrating a digital still camera as one of these examples.

The photoelectric conversion system illustrated in FIG. 6 includes an imaging apparatus 1004 that is an example of the photoelectric conversion apparatus according to one of the above-described exemplary embodiments, and a lens 1002 that forms an optical image of a subject on the imaging apparatus 1004. The photoelectric conversion system also includes a diaphragm 1003 that varies the amount of light passing through the lens 1002, and a barrier 1001 that protects the lens 1002. The lens 1002 and the diaphragm 1003 are an optical system for collecting light on the imaging apparatus 1004. The imaging apparatus 1004 is the photoelectric conversion apparatus according to one of the above-described exemplary embodiments and converts the optical image formed by the lens 1002 into an electric signal.

The photoelectric conversion system further includes a signal processing unit 1007 as an image generation unit that generates an image by processing a signal output from the imaging apparatus 1004. The signal processing unit 1007 performs an operation of outputting image data by performing various types of correction and compression as needed. The signal processing unit 1007 may be formed on a semiconductor substrate on which the imaging apparatus 1004 is provided, or a semiconductor substrate different from the semiconductor substrate on which the imaging apparatus 1004 is provided.

The photoelectric conversion system further includes a memory unit 1010 that temporarily stores image data, and an external interface (I/F) unit 1013 that is used to communicate with an external computer. The photoelectric conversion system further includes a recording medium 1012 such as a semiconductor memory in or from which captured data is recorded or read, and a recording medium control I/F unit 1011 that is used to record or read the captured data in or from the recording medium 1012. The recording medium 1012 may be built into the photoelectric conversion system, or may be detachably attached to the photoelectric conversion system.

Furthermore, the photoelectric conversion system includes an overall control/calculation unit 1009 that performs various calculations and controls the entire digital still camera, and a timing signal generation unit 1008 that outputs various timing signals to the imaging apparatus 1004 and the signal processing unit 1007. The timing signals may be input from an external apparatus, and the photoelectric conversion system may include at least the imaging apparatus 1004 and the signal processing unit 1007 that processes the signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004 and outputs image data. The photoelectric conversion system generates an image by using the image data.

As described above, according to the present exemplary embodiment, it is possible to achieve a photoelectric conversion system to which the photoelectric conversion apparatus (the imaging apparatus) according to one of the above-described exemplary embodiments is applied.

Figure 7A:
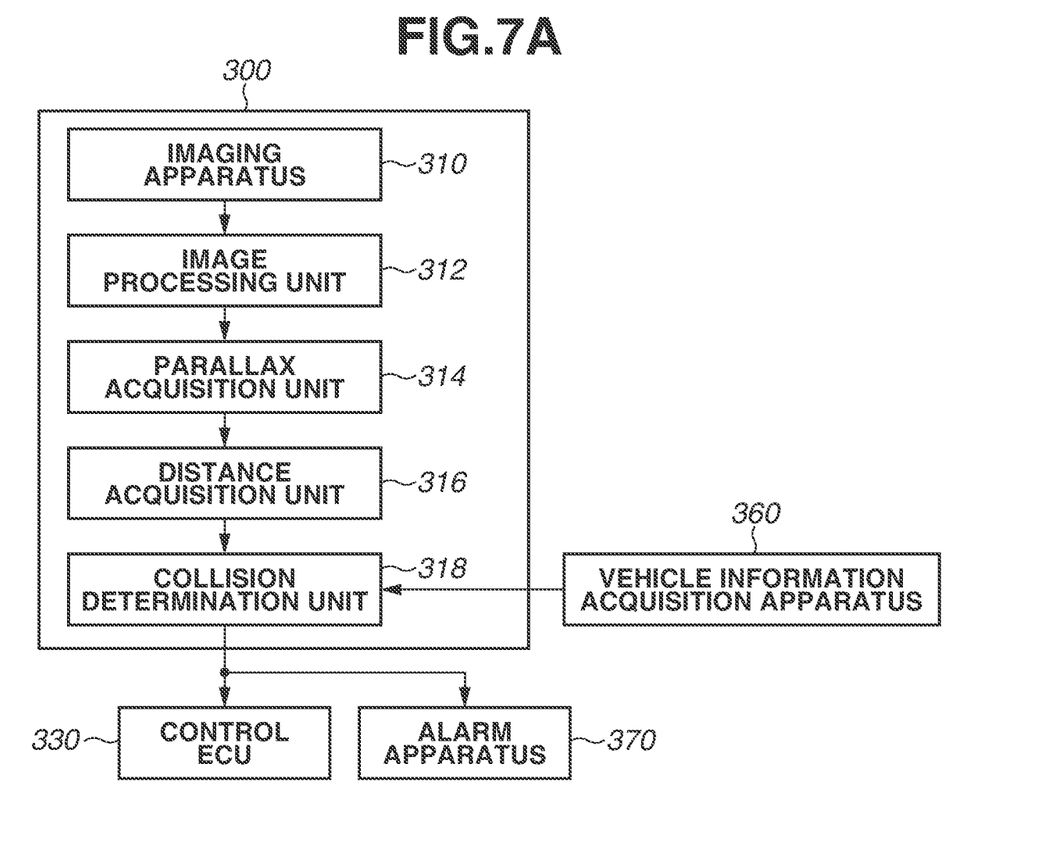
FIG. 7A is a block diagram illustrating a configuration of a photoelectric conversion system according to a fourth exemplary embodiment.
Figure 7B:
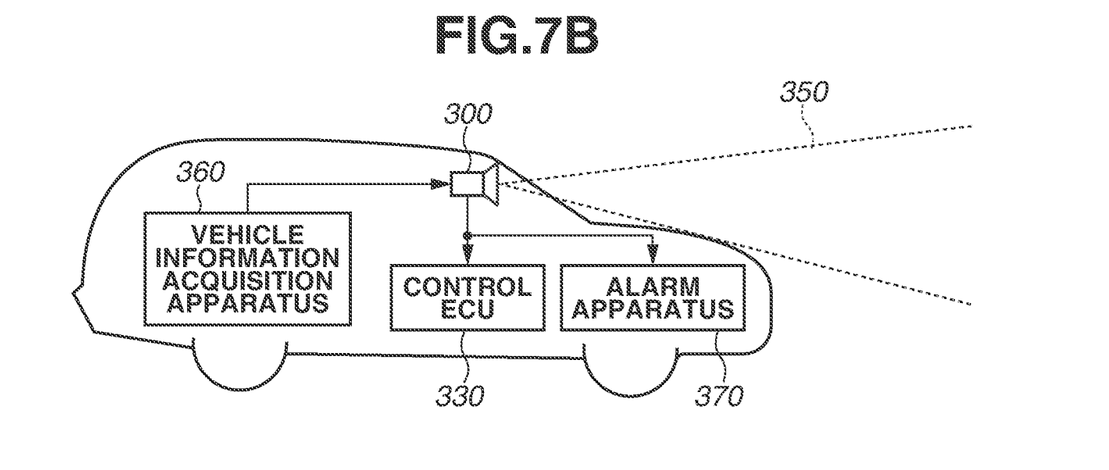
FIG. 7B is a diagram illustrating a configuration of a moving body according to the fourth exemplary embodiment.

A photoelectric conversion system 300 and a moving body according to a fourth exemplary embodiment will be described with reference to FIGS. 7A and 7B. FIG. 7A illustrates a configurations of the photoelectric conversion system 300 according to the present exemplary embodiment. FIG. 7B illustrates a configuration of the moving body according to the present exemplary embodiment.

FIG. 7A illustrates an example of the photoelectric conversion system 300 for an on-vehicle camera. The photoelectric conversion system 300 includes an imaging apparatus 310. The imaging apparatus 310 is the photoelectric conversion apparatus (the imaging apparatus) according to one of the above-described exemplary embodiments. The photoelectric conversion system 300 also includes an image processing unit 312 that performs image processing on a plurality of pieces of image data acquired by the imaging apparatus 310, and a parallax acquisition unit 314 that calculates a parallax (a phase difference between parallax images) from a plurality of pieces of image data acquired by the photoelectric conversion system 300. The photoelectric conversion system 300 further includes a distance acquisition unit 316 that calculates a distance to a target object based on the calculated parallax, and a collision determination unit 318 that determines based on the calculated distance whether there is a possibility of a collision. The parallax acquisition unit 314 and the distance acquisition unit 316 are examples of a distance information acquisition unit for acquiring distance information about the distance to the target object. More specifically, the distance information is information regarding the parallax, the amount of defocus, and the distance to the target object. Using any of these pieces of distance information, the collision determination unit 318 may determine the possibility of a collision. The distance information acquisition unit may be implemented by exclusively designed hardware or a software module. Alternatively, the distance information acquisition unit may be implemented by a field-programmable gate array (FPGA) or an application-specific integrated circuit (ASIC), or may be implemented by a combination of these.

The photoelectric conversion system 300 is connected to a vehicle information acquisition apparatus 360 and can acquire vehicle information such as a vehicle speed, a yaw rate, and a steering angle. The photoelectric conversion system 300 is also connected to a control electronic control unit (ECU) 330 that produces a braking force in the vehicle based on the determination result by the collision determination unit 318. The photoelectric conversion system 300 is also connected to an alarm apparatus 370 that gives an alarm to a driver based on the determination result by the collision determination unit 318. If there is a high possibility of a collision based on the determination result by the collision determination unit 318, for example, the control ECU 330 applies a brake, pushes back a gas pedal, or suppresses an engine output, thereby controlling the vehicle to avoid a collision and reduce damage. The alarm apparatus 370 warns a user by setting off an alarm such as a sound, displaying alarm information on a screen of an automotive navigation system, or applying a vibration to a seat belt or a steering wheel.

In the present exemplary embodiment, the photoelectric conversion system 300 captures the periphery, such as the front or the back, of the vehicle. FIG. 7B illustrates the photoelectric conversion system 300 that captures a front area (an imaging area 350) of the vehicle. The vehicle information acquisition apparatus 360 transmits an instruction to the photoelectric conversion system 300 or the imaging apparatus 310. With such a configuration, it is possible to further improve the distance measurement accuracy.

While the example where the vehicle is controlled to avoid colliding with another vehicle has been described above, the present exemplary embodiment is also applicable to a control operation for automatically driving the vehicle following another vehicle, or a control operation for automatically driving the vehicle so as to stay in a lane. Furthermore, the photoelectric conversion system 300 can be applied not only to a vehicle such as an owned car but also to a moving body (a moving apparatus) such as a vessel, an aircraft, or an industrial robot. Additionally, the photoelectric conversion system 300 can be applied not only to a moving body but also to an apparatus that uses object recognition extensively, such as an intelligent transportation system (ITS).

The disclosure is not limited to the above-descried exemplary embodiments, and can be modified in various ways.

For example, the exemplary embodiments of the disclosure also include an example where the configuration of a part of one of the exemplary embodiments is added to any other exemplary embodiment, and an example where the configuration of a part of one of the exemplary embodiments is replaced with the configuration of a part of any other exemplary embodiment.

The photoelectric conversion system according to each of the third and fourth exemplary embodiments is an example of the photoelectric conversion system to which the photoelectric conversion apparatus according to any of the exemplary embodiments of the disclosure is applicable, and the photoelectric conversion system to which the photoelectric conversion apparatus according to any of the exemplary embodiments of the disclosure is applicable is not limited to the configurations illustrated in FIGS. 6, 7A, and 7B.

All the above-described exemplary embodiments merely illustrate specific examples for carrying out the disclosure, and the technical scope of the disclosure should not be interpreted in a limited manner based on these exemplary embodiments. The disclosure can be carried out in various ways without departing from the technical idea or the main feature of the disclosure.

According to the exemplary embodiments of the disclosure, in a photoelectric conversion apparatus configured to read pixel signals by using two signal processing circuits and capable of performing analog or digital calculation appropriately, it is possible to suppress a decrease in reading speed or the complication of signal processing.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-215239, filed Dec. 24, 2020, which is hereby incorporated by reference herein in its entirety.

What is claimed is:

1. An apparatus comprising:
   a pixel array in which a plurality of pixels including a first pixel, a second pixel, a third pixel, and a fifth pixel is arranged,
   wherein in a top plan view of the pixel array, the fifth pixel, the first pixel, the second pixel, and the third pixel are arranged along a positive direction of a first direction in order, wherein the first pixel is connected to a first line,
wherein the second pixel is connected to a second line,
wherein the third pixel is connected to a third line,
wherein the fifth pixel is connected to a fifth line,
wherein the first line is connected to a first processing circuit,
wherein the second line is connected to a second processing circuit,
wherein the third line is connected to a third processing circuit,
wherein the fifth line is connected to a fifth processing circuit,
wherein the first processing circuit, the second processing circuit, the third processing circuit and the fifth processing circuit are arranged along the first direction, and the first processing circuit is located between the second processing circuit and the third processing circuit, and the second processing circuit is located between the first processing circuit and the fifth processing circuit,
wherein a first processing circuit group includes the first processing circuit and the third processing circuit,
wherein a second processing circuit group includes the second processing circuit and the fifth processing circuit,
wherein the first processing circuit group performs first calculation processing of generating a first signal by using a pixel signal read from the first line and a pixel signal read from the third line, and
wherein the second processing circuit group performs second calculation processing of generating a second signal by using a pixel signal read from the second line and a pixel signal read from the fifth line.

2. The apparatus according to claim 1,
wherein the first processing circuit includes a first comparator,
wherein the second processing circuit includes a second comparator, and
wherein the first comparator is located away from the second comparator in the positive direction of the first direction.

3. The apparatus according to claim 1, wherein in the top plan view of the pixel array, the apparatus includes a portion where the first line intersects the second line.

4. The apparatus according to claim 1,
wherein the pixel array, the first line, the second line, and the third line are provided on a first substrate,
wherein the first processing circuit, the second processing circuit, and the third processing circuit are provided on a second substrate,
wherein the first line and the first processing circuit are connected together via a first bonding portion,
wherein the second line and the second processing circuit are connected together via a second bonding portion, and
wherein in the top plan view, a first connection line between the first bonding portion and the first processing circuit intersects the second line.

5. The apparatus according to claim 1, wherein the first calculation processing and the second calculation processing are addition processing.

6. The apparatus according to claim 1, wherein a first filter covering the first pixel and a second filter covering the second pixel correspond to different colors and the first filter and a third filter covering the third pixel correspond to the same colors.

7. The apparatus according to claim 1,
wherein the pixel array, the first line, the second line, and the third line are provided on a first substrate,
wherein the first processing circuit, the second processing circuit, the third processing circuit, a first connection line, and a second connection line are provided on a second substrate,
wherein the first line and the first processing circuit are connected together via a first bonding portion and the first connection line, and
wherein the second line and the second processing circuit are connected together via a second bonding portion and the second connection line.

8. The apparatus according to claim 7, wherein, in the top plan view, a direction in which the first connection line extends intersects with a direction in which the second connection line extends.

9. The apparatus according to claim 7, wherein, on the second substrate, a virtual line extending in a second direction orthogonal to the first direction in the plan view intersects with both the first connection line and the second connection line in the plan view.

10. The apparatus according to claim 7, wherein the first bonding portion has a bonding junction of an insulator of the first substrate and an insulator of the second substrate and a bonding junction of a metal of the first substrate and a metal of the second substrate in a bonding surface.

11. The apparatus according to claim 7, wherein the first bonding portion overlaps with the pixel array in the plan view.

12. The apparatus according to claim 7, wherein the second bonding portion overlaps with the pixel array in the plan view.

13. The apparatus according to claim 1, wherein the first processing circuit is located away from the second processing circuit in a direction having a positive component of the first direction.

14. The apparatus according to claim 1, further comprising:
a fourth pixel;
wherein the first pixel and the fourth pixel are arranged in a second direction intersecting with the first direction, and the fourth pixel is connected to the first line.

15. The apparatus according to claim 1, wherein the first signal and the second signal are outputted from the apparatus.

16. The apparatus according to claim 1, wherein the pixel signal read from the first line, the pixel signal read from the second line and the pixel signal read from the third line are analog signals.

17. The apparatus according to claim 1,
wherein the first processing circuit includes a first comparator,
wherein the second processing circuit includes a second comparator,
wherein the first signal is input to the first comparator, and
wherein the second signal is input to the second comparator.

18. The apparatus according to claim 1, wherein a distance between the first processing circuit and the third processing circuit is shorter than a distance between the first processing circuit and the second processing circuit.

19. A system comprising:
an apparatus including:
a pixel array in which a plurality of pixels including a first pixel, a second pixel, a third pixel, and a fifth pixel is arranged, wherein in a top plan view of the pixel array, the fifth pixel, the first pixel, the second pixel, and the third pixel are arranged along a positive direction of a first direction in order, wherein the first pixel is connected to a first line, wherein the second pixel is connected to a second line, wherein the third pixel is connected to a third line, wherein the fifth pixel is connected to a fifth line, wherein the first line is connected to a first processing circuit, wherein the second line is connected to a second processing circuit, wherein the third line is connected to a third processing circuit, wherein the fifth line is connected to a fifth processing circuit, wherein the first processing circuit, the second processing circuit, the third processing circuit and the fifth processing circuit are arranged along the first direction, and the first processing circuit is located between the second processing circuit and the third processing circuit, and the second processing circuit is located between the first processing circuit and the fifth processing circuit, wherein a first processing circuit group includes the first processing circuit and the third processing circuit, wherein a second processing circuit group includes the second processing circuit and the fifth processing circuit, wherein the first processing circuit group performs first calculation processing of generating a first signal by using a pixel signal read from the first line and a pixel signal read from the third line, and wherein the second processing circuit group performs second calculation processing of generating a second signal by using a pixel signal read from the second line and a pixel signal read from the fifth line; and a processing unit configured to generate an image by using the first signal and the second signal.

20. The system according to claim 19, wherein the first processing circuit includes a first comparator, wherein the second processing circuit includes a second comparator, and wherein the first comparator is located away from the second comparator in the positive direction of the first direction.

21. The system according to claim 19, wherein the pixel signal read from the first line, the pixel signal read from the second line and the pixel signal read from the third line are analog signals.

22. A moving body comprising:

an apparatus including:

a pixel array in which a plurality of pixels including a first pixel, a second pixel, a third pixel, and a fifth pixel is arranged, wherein in a top plan view of the pixel array, the fifth pixel, the first pixel, the second pixel, and the third pixel are arranged along a positive direction of a first direction in order, wherein the first pixel is connected to a first line, wherein the second pixel is connected to a second line, wherein the third pixel is connected to a third line, wherein the fifth pixel is connected to a fifth line, wherein the first line is connected to a first processing circuit, wherein the second line is connected to a second processing circuit, wherein the third line is connected to a third processing circuit, wherein the fifth line is connected to a fifth processing circuit, wherein the first processing circuit, the second processing circuit, the third processing circuit and the fifth processing circuit are arranged along the first direction, and the first processing circuit is located between the second processing circuit and the third processing circuit, and the second processing circuit is located between the first processing circuit and the fifth processing circuit, wherein a first processing circuit group includes the first processing circuit and the third processing circuit, wherein a second processing circuit group includes the second processing circuit and the fifth processing circuit, wherein the first processing circuit group performs first calculation processing of generating a first signal by using a pixel signal read from the first line and a pixel signal read from the third line, and wherein the second processing circuit group performs second calculation processing of generating a second signal by using a pixel signal read from the second line and a pixel signal read from the fifth line; and a control unit configured to control a movement of the moving body by using the first signal and the second signal.

23. The moving body according to claim 22, wherein the first processing circuit includes a first comparator, wherein the second processing circuit includes a second comparator, and wherein the first comparator is located away from the second comparator in the negative direction of the first direction.

24. The moving body according to claim 22, wherein in the top plan view of the pixel array, the apparatus includes a portion where the first line intersects the second line.

25. The moving body according to claim 22, wherein the pixel signal read from the first line, the pixel signal read from the second line and the pixel signal read from the third line are analog signals.

* * * * *